United States Patent [19]

Herrick

[11] Patent Number: 5,204,497
[45] Date of Patent: Apr. 20, 1993

[54] COMPUTER FRONT PANEL WITH OFFSET AIRFLOW LOUVERS

[75] Inventor: Gregory E. Herrick, Minneapolis, Minn.

[73] Assignee: Zeos International, Inc., New Brighton, Minn.

[21] Appl. No.: 544,116

[22] Filed: May 30, 1990

[51] Int. Cl.⁵ .............................................. H05K 9/00
[52] U.S. Cl. .................................. 174/35 R; 361/424
[58] Field of Search .................. 52/473, 506; 361/424; 174/35 R, 35 GC

[56] References Cited

U.S. PATENT DOCUMENTS

| | | | |
|---|---|---|---|
| 4,335,797 | 6/1982 | Simmons | 52/473 X |
| 4,384,165 | 5/1983 | Loving, Jr. et al. | 174/35 GC |
| 4,399,316 | 8/1983 | Woodward | 361/424 X |
| 4,616,101 | 10/1986 | Veerman et al. | |
| 4,688,767 | 8/1987 | Bradshaw | 52/473 X |
| 4,709,659 | 12/1987 | Quante, III et al. | 52/473 X |
| 4,777,565 | 10/1988 | McIntosh | |
| 4,780,570 | 10/1988 | Chuck | 361/424 X |
| 4,785,136 | 11/1988 | Mollet et al. | 174/35 R |
| 4,829,402 | 5/1989 | Gewebler et al. | |
| 4,872,090 | 10/1989 | Taylor et al. | 361/424 |
| 4,873,394 | 10/1989 | Bhargava et al. | |
| 4,873,395 | 10/1989 | Mast | |
| 4,899,647 | 2/1990 | Garries et al. | 52/473 X |

*Primary Examiner*—David A. Scherbel
*Assistant Examiner*—Creighton Smith

[57] ABSTRACT

A computer front panel including louvered offset slots oriented to minimize or negate the transmission of internally generated electromagnetic interference outwardly through the slots. The slots include slot openings which align along a horizontal plane through which flow of cooling air in a vertical fashion only is allowed. The slots, slot opening surfaces and the entire inner back surface of the RF front panel is coated with a metallic conductive substance to shunt any electromagnetic RF interference to ground.

7 Claims, 12 Drawing Sheets

| FIG. 2a | FIG. 2b |
|---|---|

| FIG. 3a | FIG. 3b |
|---|---|

| FIG. 4a | FIG. 4b |
|---|---|

| FIG. 5a | FIG. 5b |
|---|---|

FIG. 1

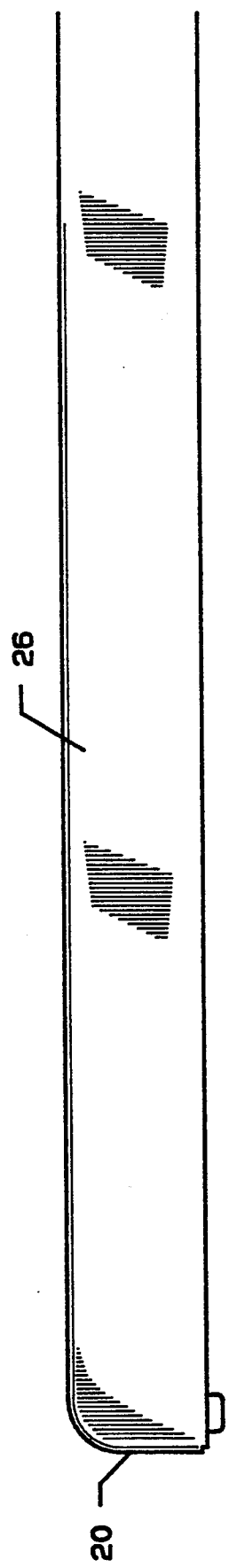

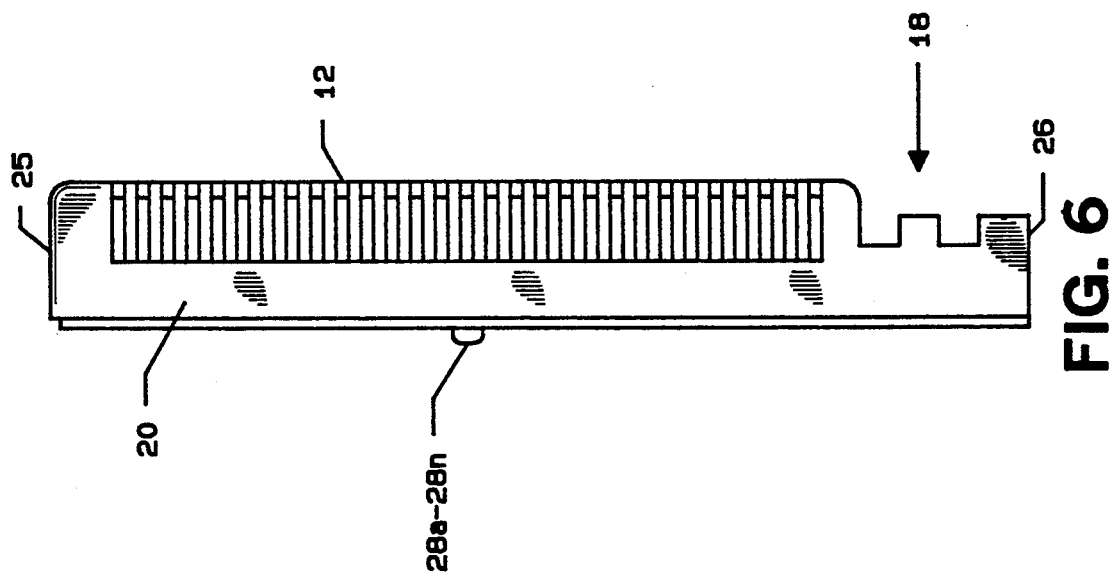

5,204,497

COMPUTER FRONT PANEL WITH OFFSET AIRFLOW LOUVERS

BACKGROUND OF THE INVENTION

1. Field of the Invention

The present invention pertains to a computer front panel for a computer system, such as a personal computer, and more particularly, pertains to a computer front panel for the minimizing or negating electromagnetic interference.

2. Description of the Prior Art

Prior art computer panels have generally been crafted of plastic with louvered slots which are oriented vertically to allow for inflow or outflow of air strictly in a horizontal direction. As a consequence, there is an outflow of internally generated electromagnetic interference in a horizontal direction through the slots.

The present invention overcomes the disadvantages of the prior art by providing a computer front panel with horizontally oriented louvre slots which are also conductively coated to minimize or negate the outflow of electromagnetic interference.

SUMMARY OF THE INVENTION

The general purpose of the present invention is to provide a computer front panel which minimizes or negates the flow of electromagnetic interference therethrough. Slot openings are aligned along a horizontal plane in an offset geometrical configuration and are coated with a conductive coating to prohibit the flow of electromagnetic interference from the panel.

According to one embodiment of the present invention, there is provided a computer front panel with a louvered area for the inflow or outflow of cooling air. The louvered area includes one or more recesses with a slot opening aligned horizontally at an upper and inner portion of the recess. A front side slot channel connects to a slot channel leading to the backside of the panel. Cooling air flows upwardly through the slot opening and then horizontally through the slot channel. The slot channel is geometrically designed as a chamber and oriented in an offset manner so that RF transmission is different and attenuated by the interference of the mechanical path. The slot channel and the back of the panel are further coated with a conductive substance to direct RF energy to ground.

One significant aspect and feature of the present invention is a computer panel with horizontally aligned offset openings.

Another significant aspect and feature of the present invention is a computer panel with a conductive inner surface coating to further alternate RF transmissions.

Having thus described embodiments of the invention, it is the principal object hereof to provide a computer front panel with offset louvers for minimizing or negating electromagnetic interference through the computer panel.

One object of the present invention is a computer front panel with offset geometrical air louvers to reduce or negate RF transmission through the panel.

BRIEF DESCRIPTION OF THE DRAWINGS

Other Objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 1 illustrates the orientation of FIGS. 2A-2B, 3A-3B, 4A-4B an with respect to each other;

FIGS. 4A-4B illustrate a bottom view of the computer panel;

FIG. 6 illustrates an end view of the computer panel;

DESCRIPTION OF THE PREFERRED EMBODIMENTS

FIG. 1 illustrates the orientation of FIGS. 2A-2B, 3A-3B, 4A-4B and 5A-5B with respect to each other.

Figure 2A:
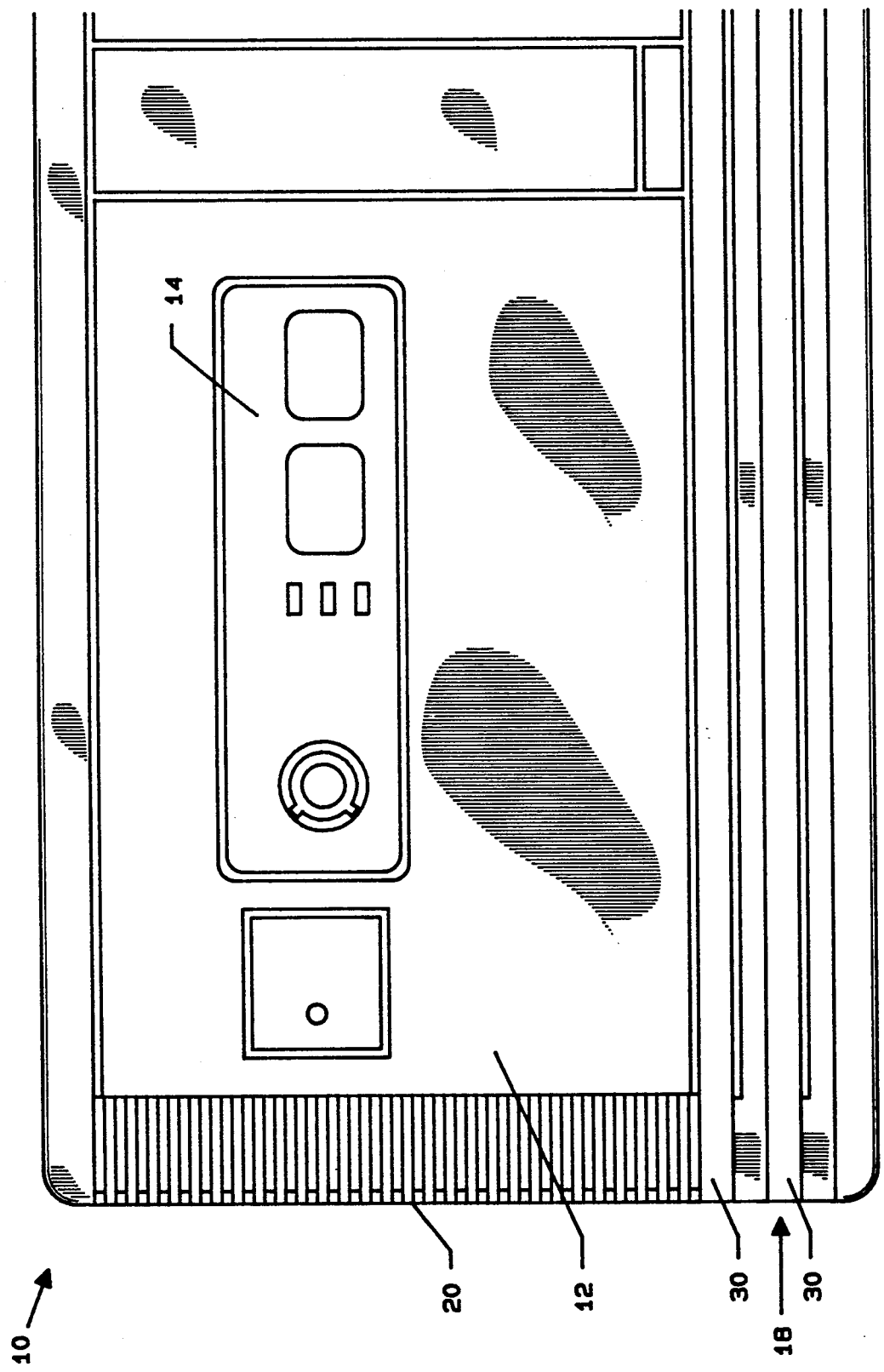
FIGS. 2A-2B illustrate the front side of the computer panel.
Figure 2B:
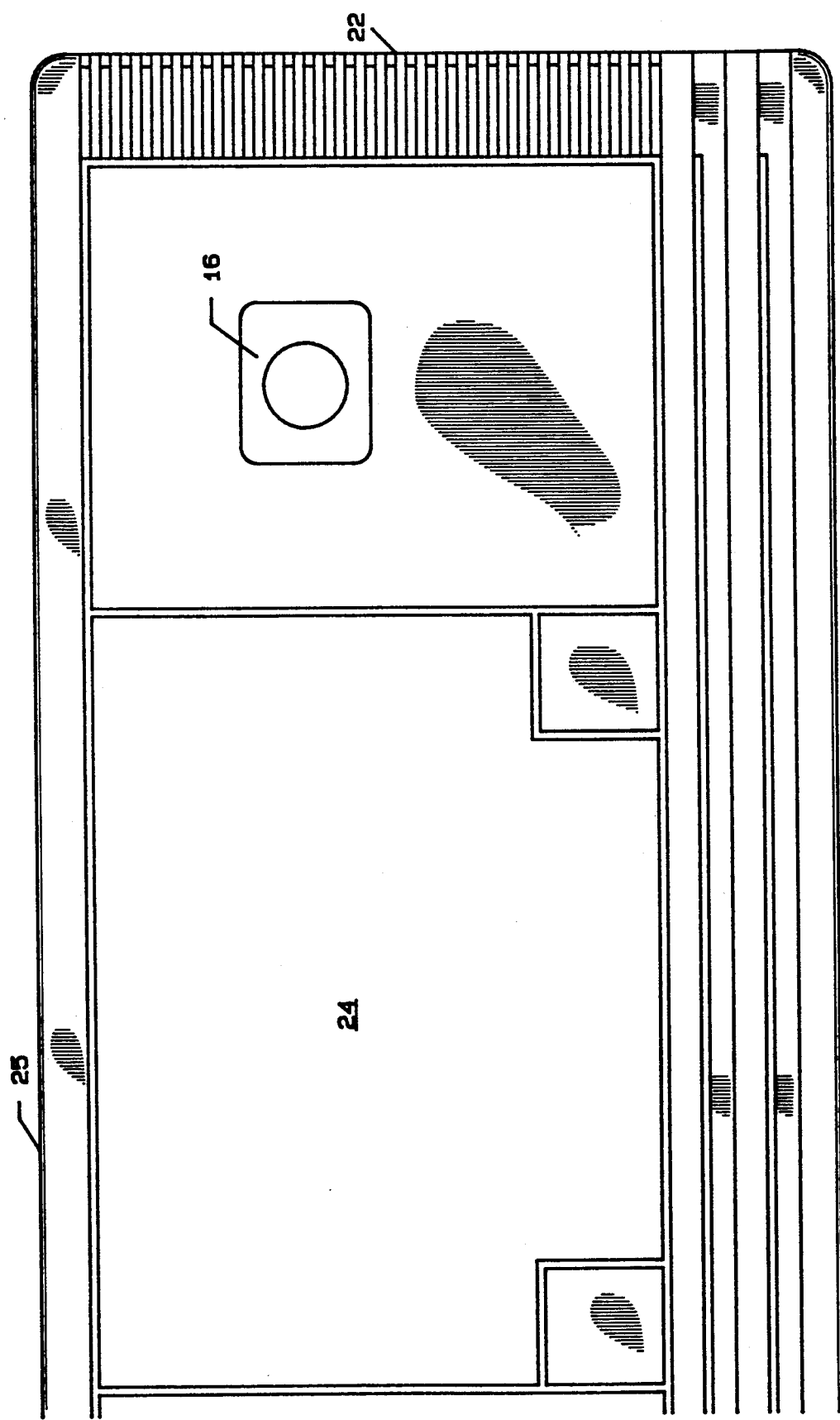

FIGS. 2A-2B illustrate the front side 12 of the computer panel 10 including a control and annunciator panel 14 and a control button 16. A louvre panel 18 extends along and about the lower front area between opposing planar ends 20 and 22. A cutout 24 aligns centrally in the computer front panel 12. The computer panel 10 also includes a planar top and bottom 25 and 26 as also illustrated in FIGS. 3A-3B and 4A-4B.

Figure 3A:
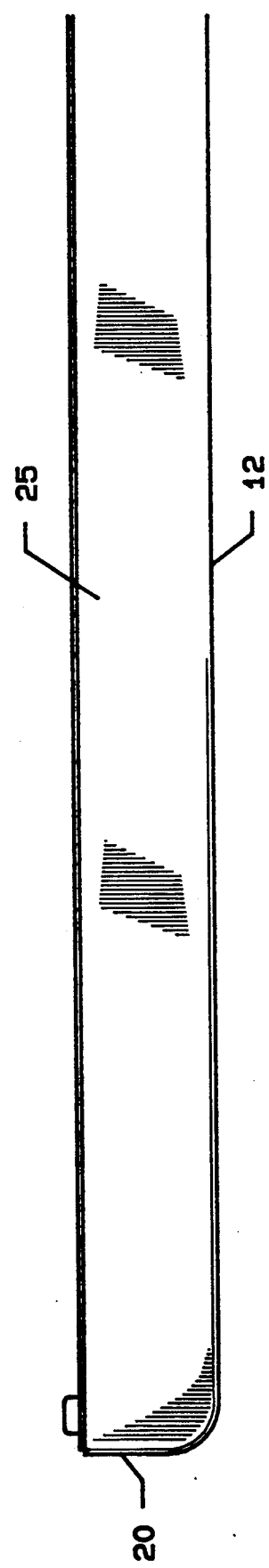
FIGS. 3A-3B illustrate a top view of the computer panel.
Figure 3B:
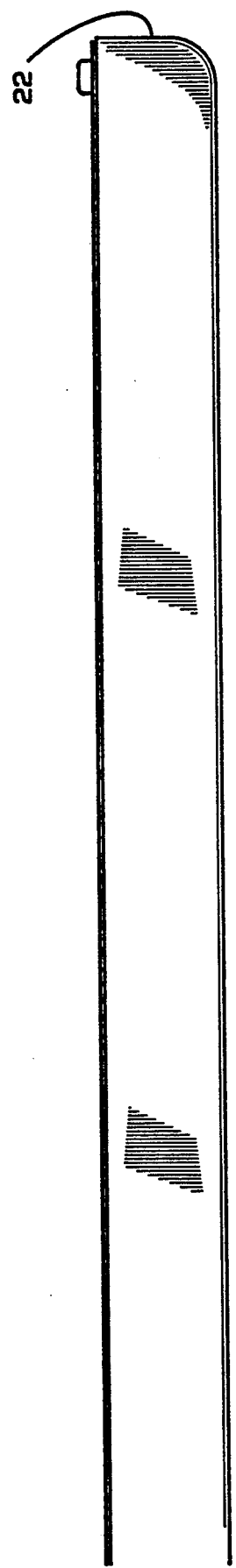

FIGS. 3A-3B illustrate a top view of the computer panel 10 including the top planar surface 25 where all numerals correspond to those elements previously described.

Figure 4B:
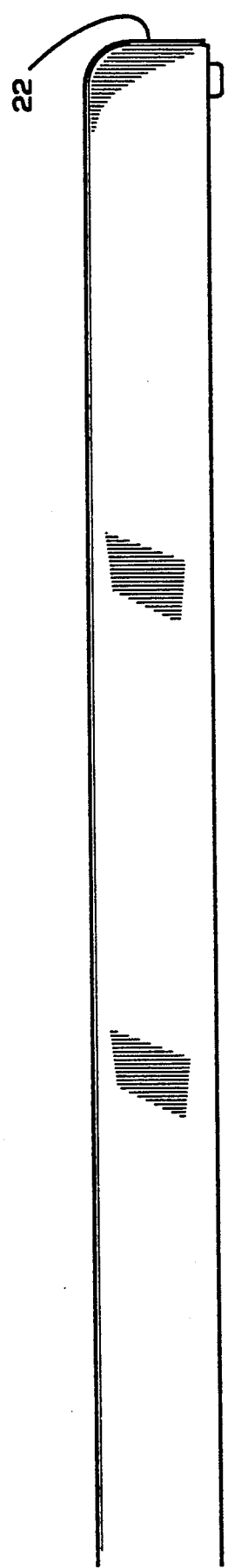

FIGS. 4A-4B illustrate a bottom view of the computer panel 10 including the bottom planar surface where all numerals correspond to those elements previously described.

Figure 5A:
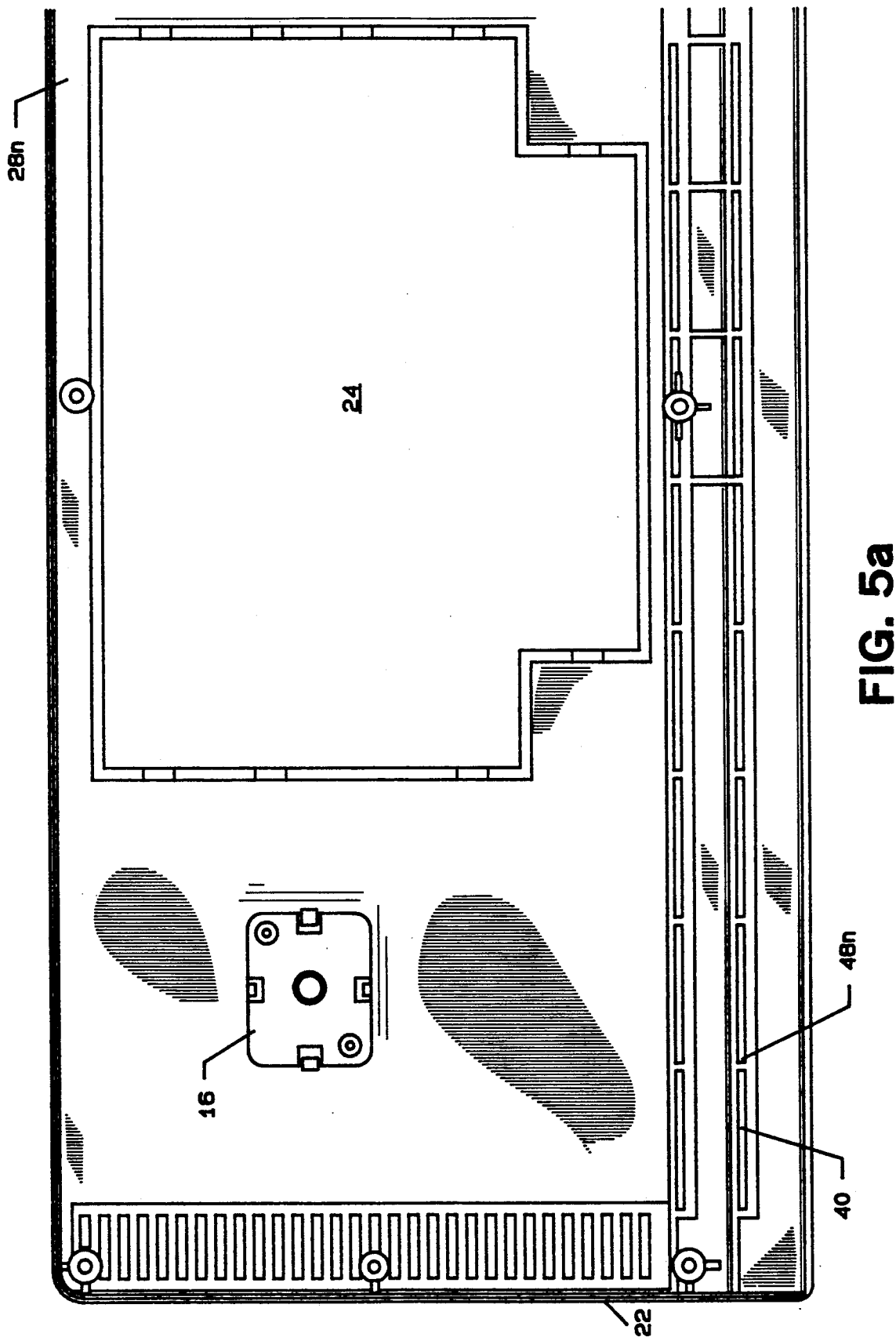
FIGS. 5A-5B illustrate a rear view of the computer panel.
Figure 5B:
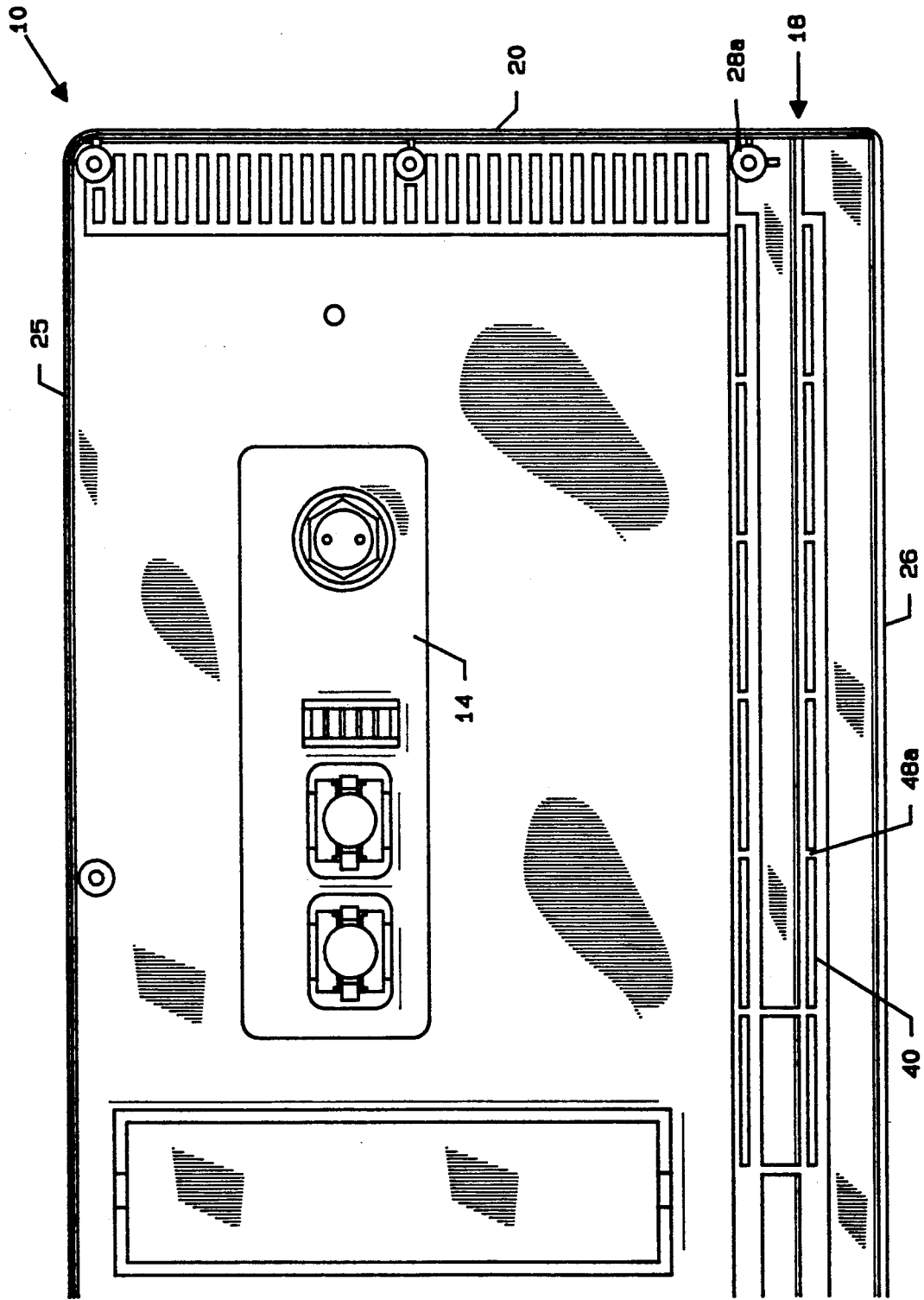

FIGS. 5A-5B illustrate a rear view of the computer panel 10 where all numerals correspond to those elements previously described. A plurality of alignment pins and holes 28a-28n align near the inner periphery of the computer panel for mating with computer cabinetry.

FIG. 6 illustrates an end view of the computer panel 10 including the planar end 20 where all numerals correspond to those elements previously described.

Figure 7:
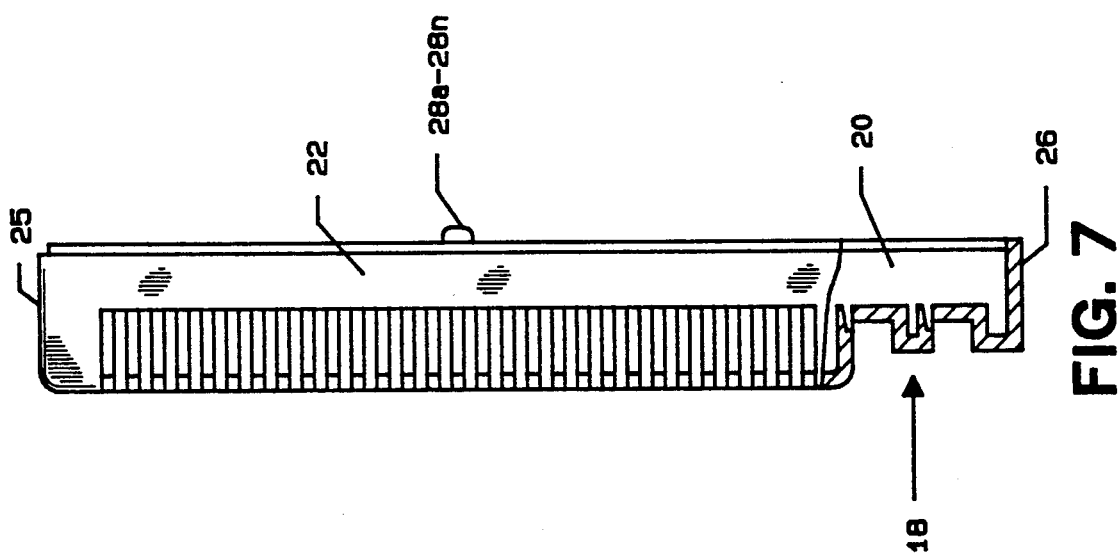
FIG. 7 illustrates an end view in partial cross section of the end of the computer panel; and, FIG. 8 illustrates a view in cross section of the louvre area.

FIG. 7 illustrates an end view in partial cross section of the computer panel 10 including the planar end 22 where all numerals correspond to those elements previously described.

Figure 8:
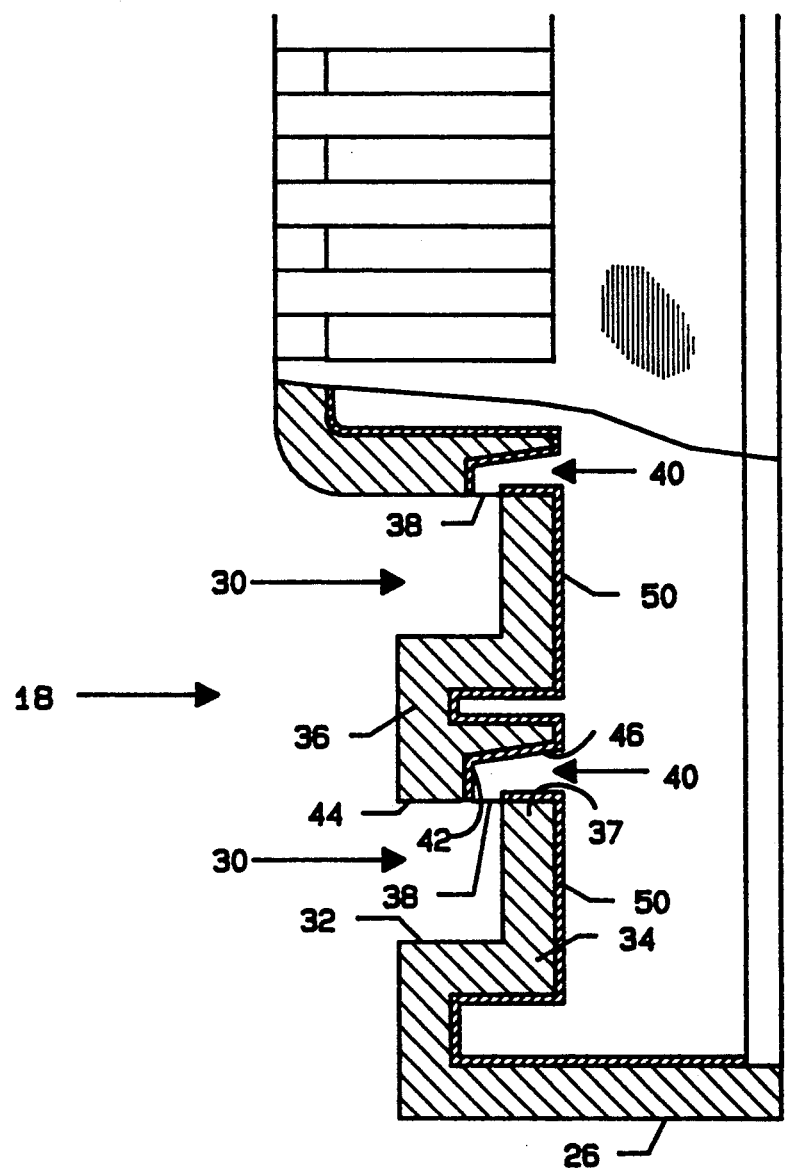

FIG. 8 illustrates a view in cross section of the louvre panel 18 of the computer panel 10. The louvre panel 18 includes one or more recesses 30. The recess 30 includes a lower horizontal member 32, a vertical member 34 extending vertically from the inner edge of the lower horizontal member 32, and an upper member 36. The lower surface 44 of the upper member 36 aligns with the upper surface 37 of the vertical member 34, and includes a longitudinal offset slot opening 38 on a common plane engaged therebetween. The longitudinally aligned slot opening 38 connects to and is an integral part of a slot channel 40. A chamber like slot channel 40 is formed by the upper surface 37 of the vertical member 34 by a vertical surface 42 adjacent and perpendicular to the lower surface 44 of the upper member 36, and an angled surface 46 which intersects the vertical surface 42. The length of the slot channel 40 can extend the entire length of the louvre panel 18 or can have a plurality of support struts 48a-48n dispersed vertically at points along the slot channel 40 as illustrated in FIG. 5A-5B. Any number of recesses 30 with slot openings 38 and slot channels 40 may be vertically stacked as required for pass through ventilation through the front panel of a computer or other RF prone generation device.

A metallic conducting paint 50, foil or other conducting mediums are applied to all the inner surfaces of the computer panel including the slot channel 40 to restrict outflow of electromagnetic interference generated inside computer cabinetry through the computer panel 10. The geometry of the slot channel is such that cooling air can flow vertically and convectionally through the slot opening 38, and thence horizontally through the slot chamber 40 in an offset fashion. Electromagnetic interference generated within the cabinetry of a computer however does not have the same luxury of convective flow as cooling air does and will not bend itself to flow outwardly through the slot channel 40 which is additionally coated with the metallic conductive paint 50 to shunt to ground any stray RF trying to escape through the RF panel. The geometrical configuration of the slot opening can be extended to have a finite height and any suitable offset configuration, even including a zig-zag (saw tooth) geometrical configuration.

MODE OF OPERATION

The offsets in the louvers of the computer front panel provide a disturbed path for RF transmission for RF signals which are internally generated in the computer cabinetry, and minimize or negate the transmission of the RF signals.

Various modifications can be made to the present invention without departing from the apparent scope hereof.

I claim:

1. Panel for a personal computer comprising:
   a. a panel member constructed to be resistant to RF transmission;
   b. a plurality of louvers in said front panel; and,
   c. an offset means in each of said louvers for blocking the path of RF transmission.

2. Computer face panel comprising:
   a. a computer panel face plate constructed of material resistant to RF transmission;
   b. a plurality of horizontal ventilation slots extending through said face plate; and,
   c. a plurality of offsets in each of said slots for eliminating straight paths through the slots for preventing passage of RF energy through the slots while allowing air passage.

3. A computer face plate of claim 2 wherein each of said offsets includes at least two opposing angled bends.

4. A ventilating panel for a personal computer comprising:
   a. a panel wall generally resistant to RF transmission from inside the personal computer to the exterior;
   b. ventilating slots in the wall for allowing passage of cooling air from the exterior into the personal computer and for generally blocking RF transmission from inside the personal computer to the exterior; and,
   c. the slots including a generally vertical passage for receiving cooling air from the exterior, a generally horizontal passage connected to the vertical passage and extending to the interior of the wall for allowing the cooling air from the vertical passage to continue into the interior of the computer, the angle of connection of the vertical passage to the horizontal passage being constructed so that RF transmission from inside the computer following the horizontal passage would be obstructed by the wall and prevented from escaping to the exterior of the wall.

5. The panel of claim 4 wherein the wall is made of plastic and has the interior side coated with metal conductive paint for shunting to ground any radio frequency transmission directed at the panel.

6. The panel of claim 4 wherein the wall is made of plastic and has an interior side coated with metallic conductive paint for shunting to ground any radio frequency transmission directed at the panel.

7. Panel for a personal computer comprising:
   a. a personal computer panel member constructed of material resistant to RF transmission;
   b. a plurality of louvers in said front panel; and,
   c. an offset means in each of said louvers for blocking the path of RF transmission.

* * * * *